United States Patent

Lange et al.

Patent Number: 6,094,360
Date of Patent: Jul. 25, 2000

[54] HF MODULE WITH HOUSING AND PRINTED CIRCUIT BOARD ARRANGED THEREIN

[75] Inventors: Joachim Lange, Krefeld; Peter Matuschik, Duisburg, both of Germany; Hugo Duran, Vessem, Netherlands

[73] Assignee: U.S. Philips Corporation, New York, N.Y.

[21] Appl. No.: 08/923,128

[22] Filed: Sep. 4, 1997

[30] Foreign Application Priority Data

Sep. 6, 1996 [DE] Germany ............ 196 36 6181

[51] Int. Cl.⁷ ................................. H05K 9/00
[52] U.S. Cl. ............ 361/799; 361/728; 361/752; 361/800; 361/816; 174/51; 439/607
[58] Field of Search .................. 361/728, 736, 361/752, 753, 796, 799, 800, 816, 814; 174/51, 35 R; 439/607–609; 334/85; 330/68; 206/719

[56] References Cited

U.S. PATENT DOCUMENTS

| | | |
|---|---|---|
| 4,841,414 | 6/1989 | Hibino et al. |
| 5,045,973 | 9/1991 | Saarela et al. .............. 361/753 X |
| 5,434,747 | 7/1995 | Shibata ........................... 361/753 |
| 5,596,487 | 1/1997 | Castaneda et al. ............ 361/814 |
| 5,748,455 | 5/1998 | Phillips et al. ................ 361/818 |

FOREIGN PATENT DOCUMENTS

| | | |
|---|---|---|
| 3535923 | 4/1986 | Germany. |
| 406178851 | 6/1994 | Japan. |

*Primary Examiner*—Leo P. Picard
*Assistant Examiner*—Jayprakash N. Gandhi
*Attorney, Agent, or Firm*—Ernestine C. Bartlett

[57] ABSTRACT

An HF module, for example a tuner, is provided with a housing (10) and a printed circuit board (11) which is arranged in the housing and supports electrical components (12). To simplify the housing and to optimize the space utilization on the printed circuit board,

- the housing (10) is trough-shaped and closed with a lid (17),
- the printed circuit board (11) is fastened in the trough-shaped housing (10), and
- an electrically conductive insert (15) is provided which has contact tags (16) in locations corresponding to the ground connection points (14) of the printed circuit board (11) and which is connected to the ground connection points (14) of the printed circuit board (11) by means of these contact tags (16).

12 Claims, 1 Drawing Sheet

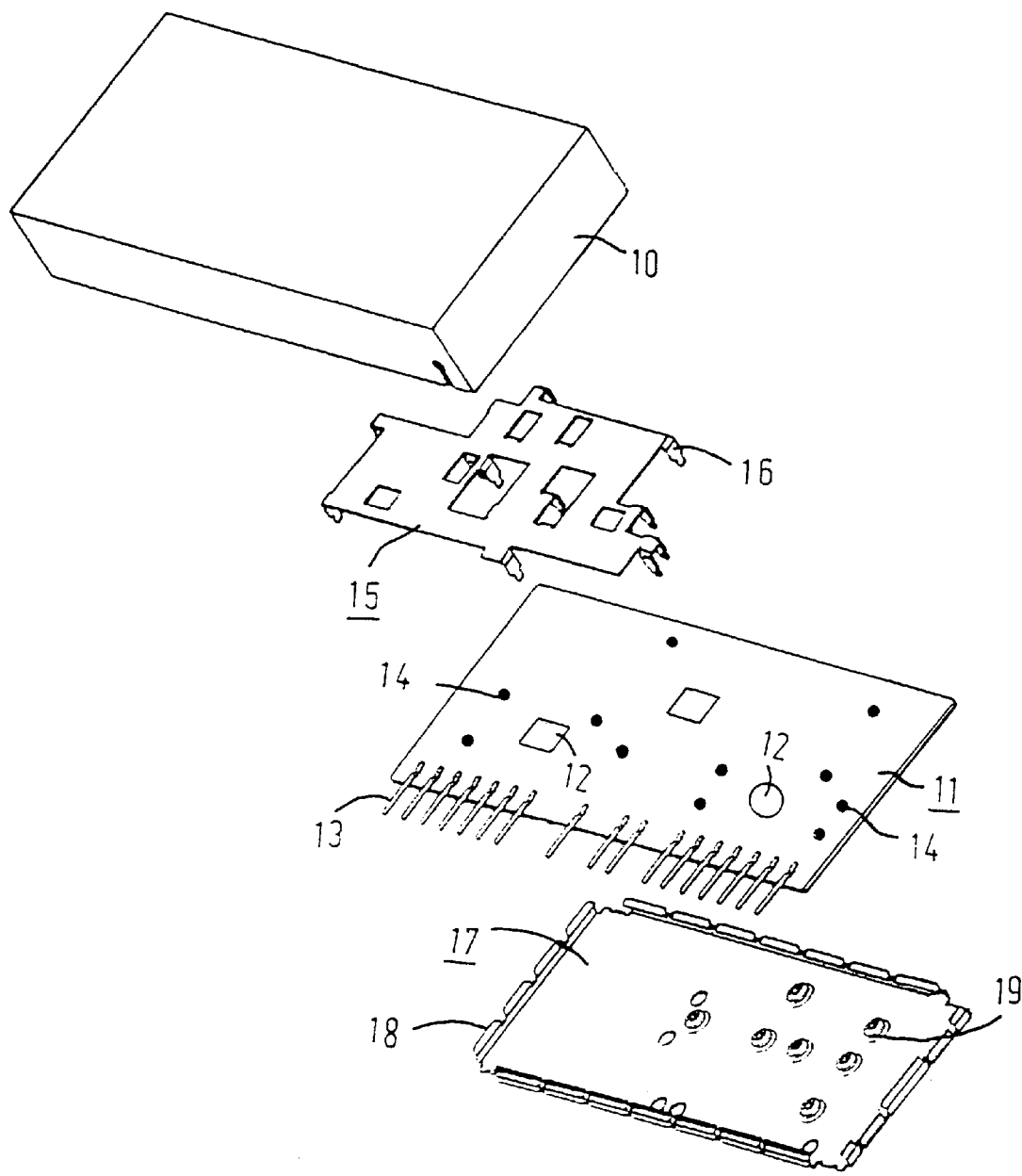

HF MODULE WITH HOUSING AND PRINTED CIRCUIT BOARD ARRANGED THEREIN

FIELD OF THE INVENTION

The invention relates to an HF module, for example a tuner, with a housing and a printed circuit board which is arranged in the housing and supports electrical components.

BACKGROUND OF THE INVENTION

Housings for such tuners are known, each housing being manufactured integrally with partition walls for a printed circuit board accommodated by the housing. Such a housing is closed with two lids. The ground connection points for the printed circuit board in such a housing are manufactured at the partition walls which were previously manufactured together with the housing walls. The positions of the ground connection points are accordingly limited to the regions of the partition walls. The same is true for another known construction for such housings where each housing is formed by a frame, by a separate insert with partition walls for each printed circuit board, and by two lids. A total of four separate components is accordingly required for such a known housing.

It is necessary nowadays to accommodate ever-increasing numbers of components on a printed circuit board, the available surface area remaining the same. If such complicated circuits should in addition be HF-resistant, additional problems will arise, for example as regards radiation, decoupling, synchronization, etc., since a reliable and effective ground connection can no longer be safeguarded with the known constructions.

DE 35 35 923 A1 discloses a construction comprising a substrate for a multilayer printed circuit arrangement where a metal plate is arranged between two printed circuits comprising a substrate each. The metal plate has tongue-type segments which are bent such that they can be passed through holes formed in the circuit substrates, so that conductor tracks on the respective outer surfaces of the circuit substrates can be grounded against the metal plate. In addition, the metal plate is resiliently connected to a frame via connection segments in the outer edge region.

SUMMARY OF THE INVENTION

The invention has for its object to simplify the construction of an HF module of the kind mentioned in the opening paragraph and to improve it in the sense that the space utilization on the printed circuit board is optimized.

According to the invention, this object is achieved in that the housing is trough-shaped and closed with a lid, the printed circuit board is fastened in the trough-shaped housing, and an electrically conductive insert is provided which has contact tags in locations corresponding to the ground connection points of the printed circuit board and which is connected to the ground connection points of the printed circuit board by means of these contact tags.

Such a construction has the advantage that fixed ground connection points on the printed circuit board, are no longer necessary as was the case until now, but the printed circuit board can first be optimally constructed as regards space utilization, such that it is possible for the ground connection points to lie in any locations of the printed circuit board as may be convenient. The insert is subsequently manufactured with the contact tags arranged in locations of the insert corresponding to the ground connection points, so that upon insertion of the insert into the printed circuit board the contact tags will come into contact with the ground connection points and can be soldered thereto. As a result of the invention, the choice of positions of the ground connection points has become completely free in such a construction. Partition walls with the ground connection points provided at their lower sides heretofore required can now be dispensed with. The insert connected by its contact tags to the ground connection points of the printed circuit board is in addition connected to the trough-shaped housing in an electrically conductive manner. Such an insert can be manufactured in a simple manner. The elimination of the partition walls which had been necessary until now renders it possible to realize a flat or wide tuner in a very simple manner. After the insert has been soldered, all grounding or zero connection points have been interconnected. In addition, the insert is also connected to the housing. Such a mechanical construction renders possible the use of printed coils, for which little space is required on the printed circuit board. In addition, further space is saved in that fewer blocking capacitors are necessary. Finally, the machine tool cost can be reduced due to a simpler mechanical construction. The improved and more effective grounding of the relevant connection points leads to an overall improvement as regards radiation, decoupling, synchronization, etc.

In an embodiment of the invention, the contact tags are narrowed in steps at their ends and abutments are formed thereby, so that the insert can be easily positioned and soldered.

A simple construction is obtained in an embodiment of the invention in which the insert is formed integrally with the contact tags.

A simple construction is furthermore achieved in a further embodiment of the invention in which the insert is formed as a ground plate, and the contact tags are formed from the ground plate by stamping-out and bending at right angles.

In a further embodiment of the invention, the contact tags may alternatively be fastened to the insert by soldering.

In a further embodiment of the invention at least a portion of each contact tag is made so long that it enters a corresponding opening of the lid and is fastened there by clamping or soldering. An optimum ground connection between the housing (frame), the insert, the printed circuit board, and the lid is safeguarded thereby, so that a very good HF screening is achieved.

BRIEF DESCRIPTION OF THE DRAWINGS

The sole FIGURE shows a diagrammatical perspective view of an embodiment of the invention.

DETAILED DESCRIPTION OF THE PREFERRED EMBODIMENTS

The Figure shows in exploded view a tuner with a trough-shaped housing, an insert, a printed circuit board, and a lid.

The trough-shaped housing 10 is, for example, stamped from a single piece of metal plating and given its trough shape by bending. Adjoining edges may in addition be interconnected by soldering. A printed circuit board 11 is fastened in the housing and is provided with components 12 diagrammatically. Reference and connection tags 13. The printed circuit board 11 also has ground connection points 14 which are provided with through holes. A metal insert 15 is provided with contact tags 16 which are bent out at right angles thereto. The positions of these contact tags 16 correspond to the positions of the ground connection points 14 present on the printed circuit board 11. The ends of the contact tags 16 enter the through holes or ground connection points 14 of the printed circuit board 11 in the assembled state and are connected thereto by soldering. The printed circuit board 11 soldered to the insert 15, when ready, is inserted into the trough-shaped housing 10 and fastened therein. Then the housing 10 is closed with a lid 17 provided with resilient clips 18. As is apparent from the Figure, the ground connection points 14 may be provided in any locations of the printed circuit board 11 as desired, wherever sufficient space is available.

Part of each contact tag 16 may be made so long that it enters the corresponding opening 19 of the lid 17. This leads to an optimum ground connection between the housing (frame) 10, the insert 15, the printed circuit board 11, and the lid 17, and accordingly to a very good screening.

What is claimed is:

1. An HF module which comprises a housing and a printed circuit board arranged in said housing and supporting electrical components, wherein
   the housing is trough-shaped and closed with a lid,
   the printed circuit board is fastened in the trough-shaped housing, and
   an electrically conductive insert is provided which is electrically connected to the housing and has contact tags in locations corresponding to ground connection points of the printed circuit board and which is connected to said ground connection points of the printed circuit board by means of said contact tags, at least a portion of each contact tag being of such length that it enters a corresponding opening of the lid.

2. An HF module as claimed in claim 1, wherein the contact tags are narrowed in steps at their ends.

3. An HF module as claimed in claim 1, wherein the insert is formed integrally with the contact tags.

4. An HF module as claimed in claim 3, wherein the insert is ground plate, and the contact tags are stamped out ground plate and bent at right angles.

5. An HF module as claimed in claim 1, wherein the insert has contact tags soldered thereto.

6. An HF module which comprises a housing and a printed circuit board arranged in said housing and supporting electrical components, wherein
   the housing is trough-shaped and closed with a lid,
   the printed circuit board comprises ground connection points and is fastened in the trough-shaped housing, and
   an electrically conductive insert is provided which is electrically connected to the housing and has contact tags in locations corresponding to the ground connection points of the printed circuit board and which is connected to said ground connection points of the printed circuit board by means of said contact tags, at least a portion of each contact tag being of such length that it enters a corresponding opening of the lid and is fastened there by clamping or soldering.

7. A tuner which comprises a housing and a printed circuit board arranged in said housing and supporting electrical components, wherein
   the housing is trough-shaped and closed with a lid,
   the printed circuit board comprises ground connection points and is fastened in the trough-shaped housing, and
   an electrically conductive insert is provided which is electrically connected to the housing and has contact tags in locations corresponding to the ground connection points of the printed circuit board and which is connected to said ground connection points of the printed circuit board by means of said contact tags, at least a portion of each contact tag being of such length that it enters a corresponding opening of the lid.

8. A tuner as claimed in claim 7, wherein the contact tags are narrowed in steps at their ends.

9. A tuner as claimed in claim 7, wherein the insert is formed integrally with the contact tags.

10. A tuner as claimed in claim 9, wherein the insert is a ground plate, and the contact tags are stamped out ground plate and bent at right angles.

11. A tuner as claimed in claim 7, wherein the insert has contact tags soldered thereto.

12. A tuner which comprises a housing and a printed circuit board arranged in said housing and supporting electrical components, wherein
   the housing is trough-shaped and closed with a lid,
   the printed circuit board is fastened in the trough-shaped housing, and
   an electrically conductive insert is provided which has contact tags in locations corresponding to the ground connection points of the printed circuit board and which is connected to said ground connection points of the printed circuit board by means of said contact tags, at least a portion of each contact tag being of such length that it enters a corresponding opening of the lid and is fastened there by clamping or soldering.

* * * * *